US008445961B2

(12) United States Patent
Khandelwal et al.

(10) Patent No.: US 8,445,961 B2
(45) Date of Patent: May 21, 2013

(54) MEASURING FLOATING BODY VOLTAGE IN SILICON-ON-INSULATOR (SOI) METAL-OXIDE-SEMICONDUCTOR-FIELD-EFFECT-TRANSISTOR (MOSFET)

(75) Inventors: Sourabh Khandelwal, Bangalore (IN); Josef S. Watts, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 12/886,064

(22) Filed: Sep. 20, 2010

(65) Prior Publication Data
US 2012/0068722 A1    Mar. 22, 2012

(51) Int. Cl.
*H01L 27/01* (2006.01)

(52) U.S. Cl.
USPC ...... 257/347; 257/48; 257/213; 257/E23.002; 324/765; 324/769

(58) Field of Classification Search
USPC ............ 257/48, 347, 213, E23.002; 438/14, 438/18, 314, 197, 278; 324/765, 769; 365/117, 365/179
See application file for complete search history.

(56) References Cited

U.S. PATENT DOCUMENTS

| 6,498,370 | B1* | 12/2002 | Kim et al. ............. 257/347 |
| 6,774,395 | B1 | 8/2004 | Lin et al. |
| 7,103,522 | B1 | 9/2006 | Shepard |
| 7,477,540 | B2 | 1/2009 | Okhonin et al. |
| 2009/0020754 | A1 | 1/2009 | Suryagandh et al. |
| 2009/0021280 | A1 | 1/2009 | Suryagandh et al. |
| 2009/0101976 | A1 | 4/2009 | Madhavan et al. |

OTHER PUBLICATIONS

Imam et al., "A Simple Method to Determine the Floating-Body Voltage of SOI CMOS Devices," Jan. 2000, pp. 21-23, IEEE Electron Device Letters, vol. 21, No. 1. Downloaded on Oct. 4, 2009 from IEEE Xplore.

Imam et al., "Determination and Assessment of the Floating-Body Voltage of SOI CMOS Devices," Apr. 2001, pp. 688-695, IEEE Transactions on Electron Devices, vol. 48, No. 4. Downloaded on Oct. 4, 2009 from IEEE Xplore.

\* cited by examiner

*Primary Examiner* — Dung A. Le
(74) *Attorney, Agent, or Firm* — Hoffman Warnick LLC; Anthony J. Canale

(57) ABSTRACT

In one embodiment, a body region of a body-contacted silicon-on-insulator (SOI) metal-oxide-semiconductor-field-effect-transistor (MOSFET) is connected to a gate of another MOSFET in a sensing circuit to form a floating body node. The voltage at the floating body node is accurately obtained at the output of the sensing circuit and used to provide an estimate of required floating body voltage over a full device operating range.

13 Claims, 6 Drawing Sheets

MEASURING FLOATING BODY VOLTAGE IN SILICON- ON-INSULATOR (SOI) METAL-OXIDE-SEMICONDUCTOR-FIELD- EFFECT-TRANSISTOR (MOSFET)

FIELD OF THE INVENTION

The present invention relates generally to silicon-on-insulator (SOI) technology, and more specifically to measuring the floating body voltage of a body-contacted SOI metal-oxide-semiconductor-field-effect-transistor (MOSFET) device, so that this measurement can be used as a reasonable estimate of the floating body voltage of a floating body SOI MOSFET of the same device dimensions.

BACKGROUND

SOI integrated circuits technology offer several advantages over bulk devices in terms of speed, isolation, density, yield and performance in the sub-micron arena. Despite these advantages, the use of SOI integrated circuits has its challenges. For example, consider a floating body of an SOI MOSFET (e.g., a field-effect-transistor (FET)) that has no contact to the body node because it resides on an insulated substrate. Because it is not contacted, it is difficult to ascertain the voltage at the floating body. Without having accurate voltage measurements of the floating body, it becomes difficult for a device engineer to model the behavior of a particular SOI MOSFET device. For example, gate voltage and drain voltage of a SOI MOSFET device are readily ascertainable, however, because a measurement for the floating body voltage is difficult to accurately ascertain, a device engineer cannot model the drain current which is a function of the gate voltage, drain voltage and floating body voltage. In order to overcome this challenge, body-contacted SOI MOSFET devices have been used to obtain a measure of floating body voltage. However, obtaining an accurate measure of the floating body voltage of a body-contacted SOI MOSFET device is a challenge for device engineers. In particular, when a floating body node is coupled to a voltmeter to obtain a measure of the floating body voltage, there will be a low flowing current that loads the node, which causes the floating body voltage to change. Therefore, any measurement of the floating body voltage at the node will be erroneous due to the current loading caused by the voltmeter.

SUMMARY

In one embodiment, a structure is disclosed. In this embodiment, the structure comprises a first body-contacted silicon-on-insulator (SOI) metal-oxide-semiconductor-field-effect-transistor (MOSFET) device having a drain region, a source region, a body region separating the drain region from the source region, and a gate disposed above the body region. A sensing circuit, coupled to the first body-contacted SOI MOSFET device, has an input and an output. The body region of the first body-contacted SOI MOSFET device is coupled to the input of the sensing circuit to form a floating body node. A voltage measure of the floating body node is obtained at the output of the sensing circuit.

In a second embodiment, a structure is disclosed that comprises an input, an output, a power supply port and a ground port. The structure further comprises a first metal-oxide-semiconductor-field-effect-transistor (MOSFET) device having a drain region, a source region, a body region separating the drain region from the source region, and a gate disposed above the body region. The gate of the first MOSFET device is coupled to the input. The drain of the first MOSFET device is coupled to the power supply port. The body region of the first MOSFET device is coupled to the source region of the first MOSFET device. The source of the first MOSFET device is coupled to the output. The structure further comprises a second metal-oxide-semiconductor-field-effect-transistor (MOSFET) device having a drain region, a source region, a body region separating the drain region from the source region, and a gate disposed above the body region. The drain region of the second MOSFET device is coupled to the source region of the first MOSFET device. The gate of the second MOSFET device is coupled to the drain region of the second MOSFET device. The body region of the second MOSFET device is coupled to the source region of the second MOSFET device. The source region of the second MOSFET device is coupled to the ground port.

In a third embodiment, a method is disclosed. In this embodiment, the method comprises: providing a first body-contacted silicon-on-insulator (SOI) metal-oxide-semiconductor-field-effect-transistor (MOSFET) device having a drain region, a source region, a body region separating the drain region from the source region, and a gate disposed above the body region, the first body-contacted SOI MOSFET device coupled to a sensing circuit having an input and an output, wherein the body region of the first body-contacted SOI MOSFET device is coupled to the input of the sensing circuit to form a floating body node having a voltage Vbody; measuring the voltage at the output of the sensing circuit, the voltage at the output of the sensing circuit represented as Vout; and determining the voltage of the floating body node Vbody from the voltage measurement at the output of the sensing circuit Vout, wherein Vbody=2*Vout.

DETAILED DESCRIPTION

Embodiments of the present invention are directed to a structure and method which enable a device engineer to directly and accurately measure the floating body voltage of a body-contacted silicon-on-insulator (SOI) metal-oxide-semiconductor-field-effect-transistor (MOSFET). In the various embodiments of the present invention, the body region of a body-contacted SOI MOSFET, such as an SOI field-effect-transistor (FET), is connected to a gate of another MOSFET that is part of a sensing circuit device. Connecting the body region of the body-contacted SOI MOSFET to the input of a sensing circuit provides a voltage at the output of the sensing circuit which can be measured with a voltmeter. Because the relationship between the input and output voltages are known, the floating body voltage can be calculated from the measured output voltage. In the various embodiments of the present invention, the body-contacted SOI MOSFET is not subject to the current loading of the voltmeter, because the sensing circuit isolates the floating body from the voltmeter. Therefore, the indirect measurement of the floating body voltage provided by the various embodiments of the present invention is accurate and not limited by any current loading.

Technical effects provided by the various embodiments of the present invention are applicable to modeling of integrated circuit devices and to design of integrated circuit devices. For example, in the modeling of integrated circuit devices that utilize SOI MOSFETs, it is desirable to describe the device behavior of these types of MOSFETS. In particular, device engineers typically would like to know the voltage of a floating body because this value along with gate voltage and drain voltage are used to ascertain drain current. Since the various embodiments of the present invention provide an accurate way of directly obtaining the floating body voltage, device engineers can use this value along with other easily measurable parameters (e.g., gate voltage, drain voltage, etc.) to model or predict the drain currents of integrated circuit device designs over a full operating range. Note that it is helpful to have an accurate measure of the floating body voltage because as it moves up and down, the threshold voltage of a device will change, and as a result, the value of the drain current changes. With regard to the device design perspective, a device engineer of an SOI MOSFET device would typically like to know what the floating body voltage will be under different gate and drain conditions. This information is helpful because a device engineer of an SOI MOSFET wants to ensure that the floating body voltage of a particular device does not go beyond desired ranges.

Figure 1:
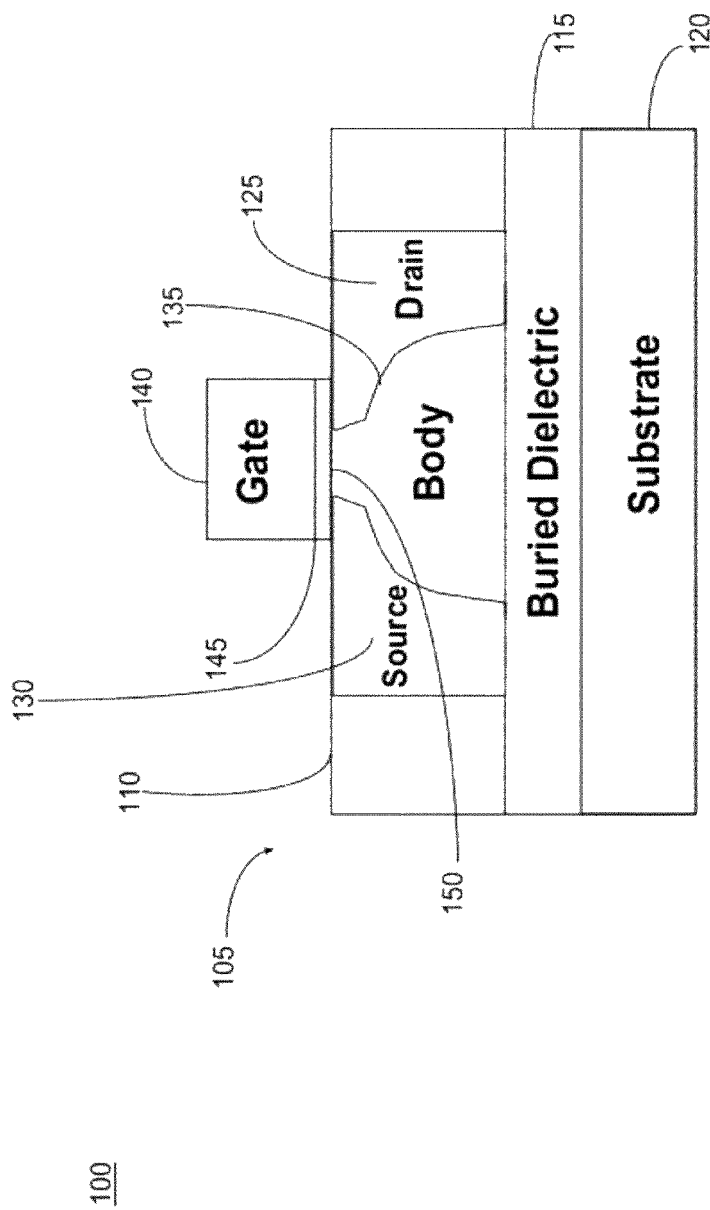
FIG. 1 shows a cross-sectional view of a silicon-on-insulator (SOI) metal-oxide-semiconductor-field-effect-transistor (MOSFET)

FIG. 1 shows a cross-sectional view of a structure 100. In this embodiment, structure 100 is a floating body SOI MOSFET device 105. In one embodiment, floating body SOI MOSFET device 105 is a FET. Floating body SOI MOSFET device 105 includes a semiconductor layer 110 formed over a buried dielectric layer 115, which is formed on a substrate 120. As shown in FIG. 1, semiconductor layer 110 comprises a drain region 125, a source region 130, a body region (i.e., the channel) 135 separating the drain region from the source region, and a gate 140 disposed above the drain region, source region and body region. In one embodiment, gate 140 is situated over a gate oxide layer 145. Structure 100 is a floating body SOI MOSFET device 105 because a body node 150 of body region 135 has no contact. Contact of body node 150 can be made through special layers (not shown) in order to control its voltage. As a result, SOI MOSFET device 105 is referred to as a body-contacted SOI MOSFET.

In one embodiment, semiconductor layer 110 can comprise silicon and gate oxide layer 145 can comprise silicon oxide or a metal oxide. In one embodiment, drain region 125 and source region 130 can be heavily doped with a suitable N-type dopant or a P-type dopant. Buried dielectric layer 115 can be any suitable insulating material, such as, for example, oxide; while substrate 120 can comprise silicon. Floating body SOI MOSFET device 105 may correspond to a floating body N-type FET (NFET) or a P-type FET (PFET).

Figure 2:
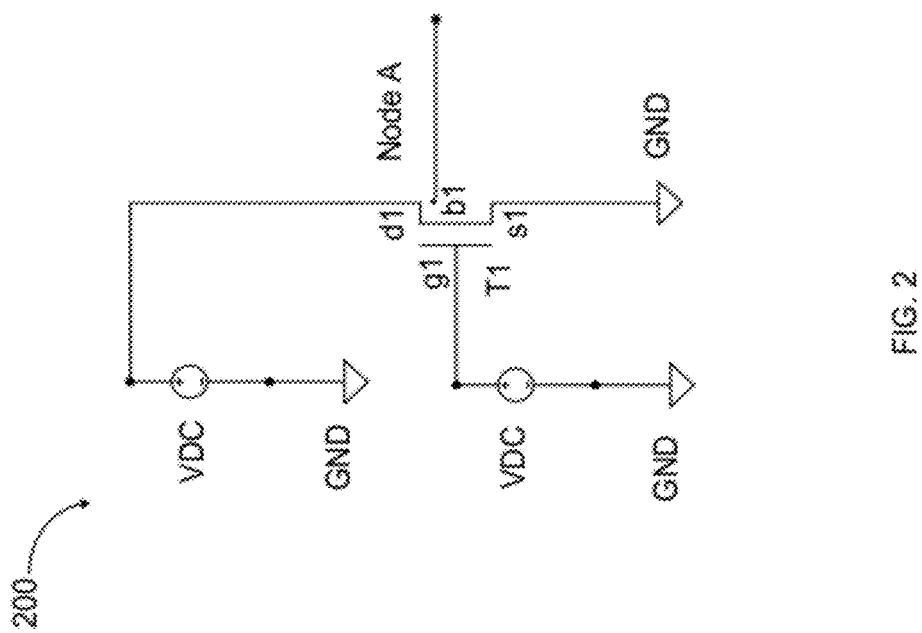
FIG. 2 shows a circuit diagram of a body-contacted SOI MOSFET structure.

FIG. 2 shows a circuit diagram of a body-contacted SOI MOSFET structure 200. As shown in FIG. 2, body-contacted SOI MOSFET structure 200 comprises a SOI MOSFET T1 having a drain region d1, a source region s1, a body region b1 separating drain region d1 from source region s1, and a gate g1 disposed above drain region d1, source region s1 and body region b1. Gate g1 and drain d1 are each coupled to a positive terminal of a power supply VDC via a power supply port. The negative terminal of power supply VDC is connected to ground GND. As shown in FIG. 2, body region b1 of SOI MOSFET T1 has a Node A that is not contacted. Hence, body region b1 is considered to be floating.

Figure 3:
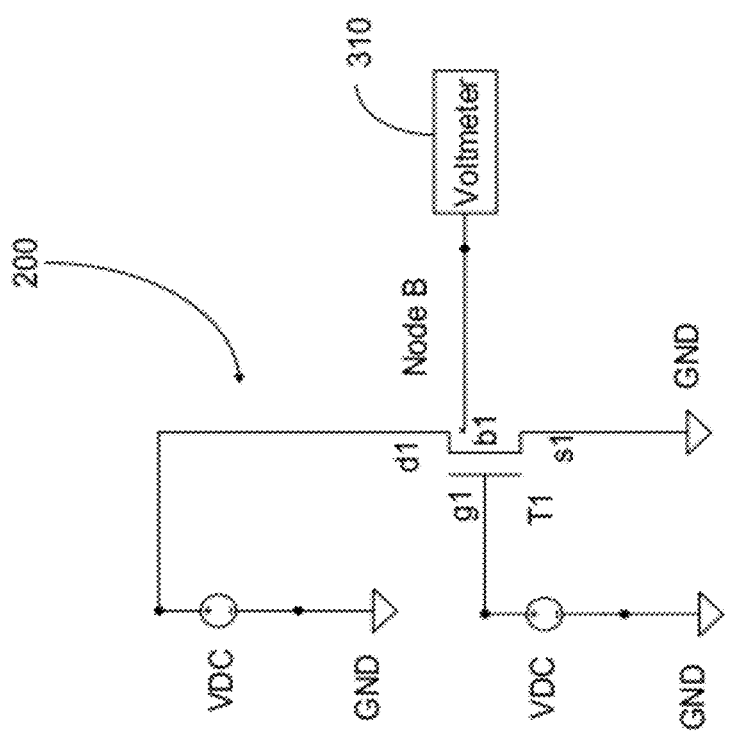
FIG. 3 shows a circuit diagram of the body-contacted SOI MOSFET structure depicted in FIG. 2 coupled to a voltmeter to obtain a measurement of the floating body voltage.

As mentioned above, it is desirable for device engineers to be able to ascertain what the floating body voltage of a body-contacted SOI MOSFET is in order to describe device behavior during modeling of a device. In addition, it is also desirable to know what the floating body voltage will be under different gate and drain conditions while designing an SOI MOSFET. In one embodiment, the floating body voltage can be attempted to be measured in FIG. 2 via Node A. FIG. 3 shows a circuit diagram of the body-contacted SOI MOSFET T1 200 depicted in FIG. 2 coupled to a voltmeter 310 to obtain a measurement of the floating body voltage at Node B, which is representative of Node A in this figure. Because body Node B is coupled directly to voltmeter 310, it gets loaded as voltmeter draws some current from the node. This causes the floating body voltage of Node B to change because the draining out of current, and thus the floating body voltage of Node B as measured by voltmeter 310 will be erroneous. Therefore, a device engineer cannot accurately measure the floating body voltage of Node B by coupling voltmeter 310 to the node.

Figure 4:
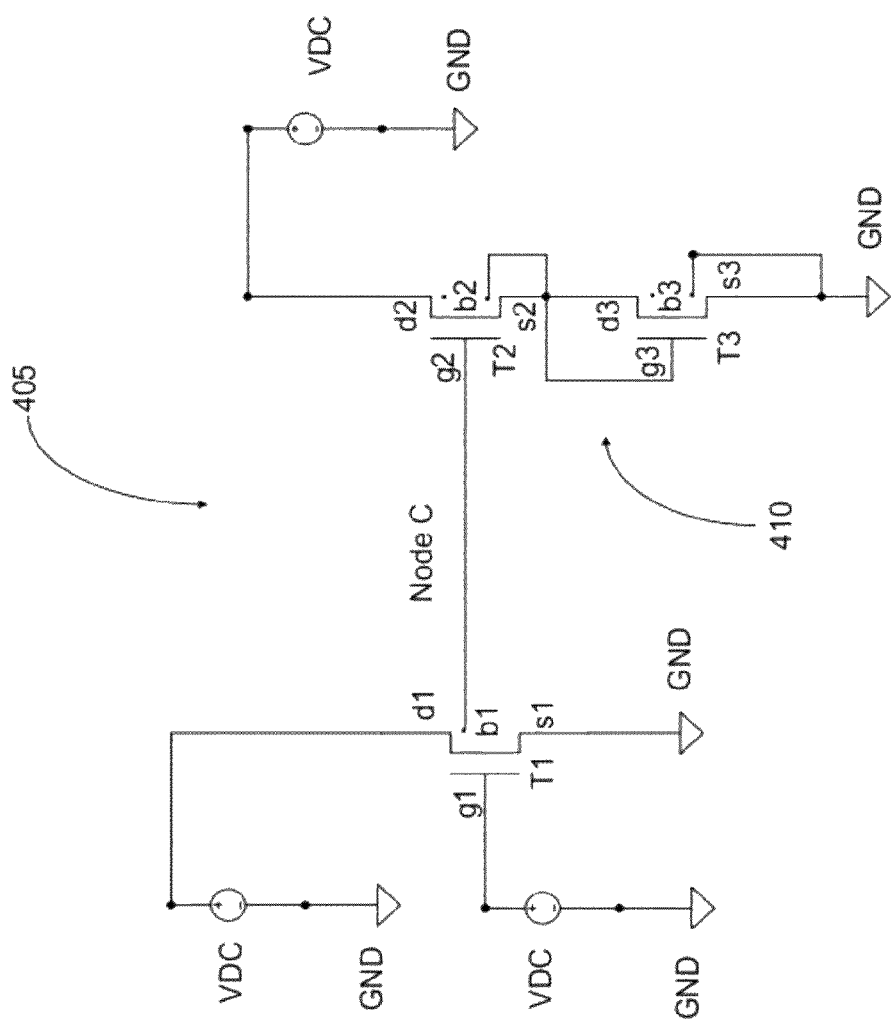
FIG. 4 shows a circuit diagram of a structure according to an embodiment of the present invention.

FIG. 4 shows a circuit diagram of a structure 405 that facilitates direct and accurate measurement of a body-contacted SOI MOSFET structure according to an embodiment of the present invention. As shown in FIG. 4, structure 405 includes a body-contacted SOI MOSFET device T1 having a drain region d1, a source region s1, a body region b1 separating drain region d1 from source region s1, and a gate g1 disposed above drain region d1, source region s1 and body region b1. Source region s1, drain region d1, and gate g1 are configured to allow for an externally applied voltage VDC. In particular, gate g1 and drain d1 are each coupled to a positive terminal of a power supply VDC via a power supply port. The negative terminal of the power supply VDC is connected to ground GND.

Structure 405 further comprises a sensing circuit 410 that facilitates measuring the floating body voltage of Node C. As shown in FIG. 4, sensing circuit 410 comprises a body-contacted SOI MOSFET device T2, coupled to a body-contacted SOI MOSFET device T3. Body-contacted SOI MOSFET device T2 and body-contacted SOI MOSFET device T3 each has a drain region (d2 and d3), a source region (s2 and s3), a body region (b2 and b3) separating the drain region from the source region. In addition, SOI MOSFET device T2 and SOI MOSFET device T3 each has a gate (g2 and g3) disposed above their respective drain regions, source regions and body regions. In more particular detail, as shown in FIG. 4, gate g2 of SOI MOSFET device T2 is coupled to body region b1 of SOI MOSFET device T1. In one embodiment, drain region d2 of SOI MOSFET device T2 is coupled to a terminal of a positive power supply VDC via a power supply port and the source region s3 of SOI MOSFET device T3 is connected to a negative power supply VDC via a power supply port. In another embodiment, drain region d2 of SOI MOSFET device T2 is coupled to a terminal of a positive power supply VDC via a power supply port and the source region s3 of SOI MOSFET device T3 is connected to ground GND via a power supply port. Body region b2 of SOI MOSFET device T2 is coupled to source region s2 of SOI MOSFET device T2. Source region s2 of SOI MOSFET device T2 is coupled to drain region d3 of SOI MOSFET device T3. Gate g3 of SOI MOSFET device T3 is coupled to the drain region d3 of SOI MOSFET device T3. Body region b3 of SOI FET device T3 is coupled to source region s3 of SOI MOSFET device T3.

In one embodiment, SOI MOSFET device T2 and SOI MOSFET device T3 have identical geometries (i.e., identical gate lengths, gate widths and gate stacks). In another embodiment, SOI MOSFET device T2 and SOI MOSFET device T3 have identical doping concentrations. In another embodiment, SOI MOSFET device T2 and SOI MOSFET device T3 each has a gate input leakage of less than about 1 pico amp (pA). Having a gate input leakage of less than about 1 pA is desirable because, otherwise, it will load body region b1 of SOI MOSFET device T1, as it will draw current from it. In another embodiment, SOI MOSFET device T2 and SOI MOSFET device T3 each has a threshold voltage of less than about 100 milli volts (mV). Having a threshold voltage of less than about 100 mV is desirable because it facilitates accurate measurement of the node voltage of body region b1 of SOI MOSFET device T1. In particular, to obtain an accurate measurement of the node voltage of body region b1 of SOI MOSFET device T1 through sensing circuit 410, both SOI MOSFET devices T2 and T3 should be in saturation. Having a threshold voltage of less than about 100 mV will ensure this for most of the voltage measurement.

Figure 5:
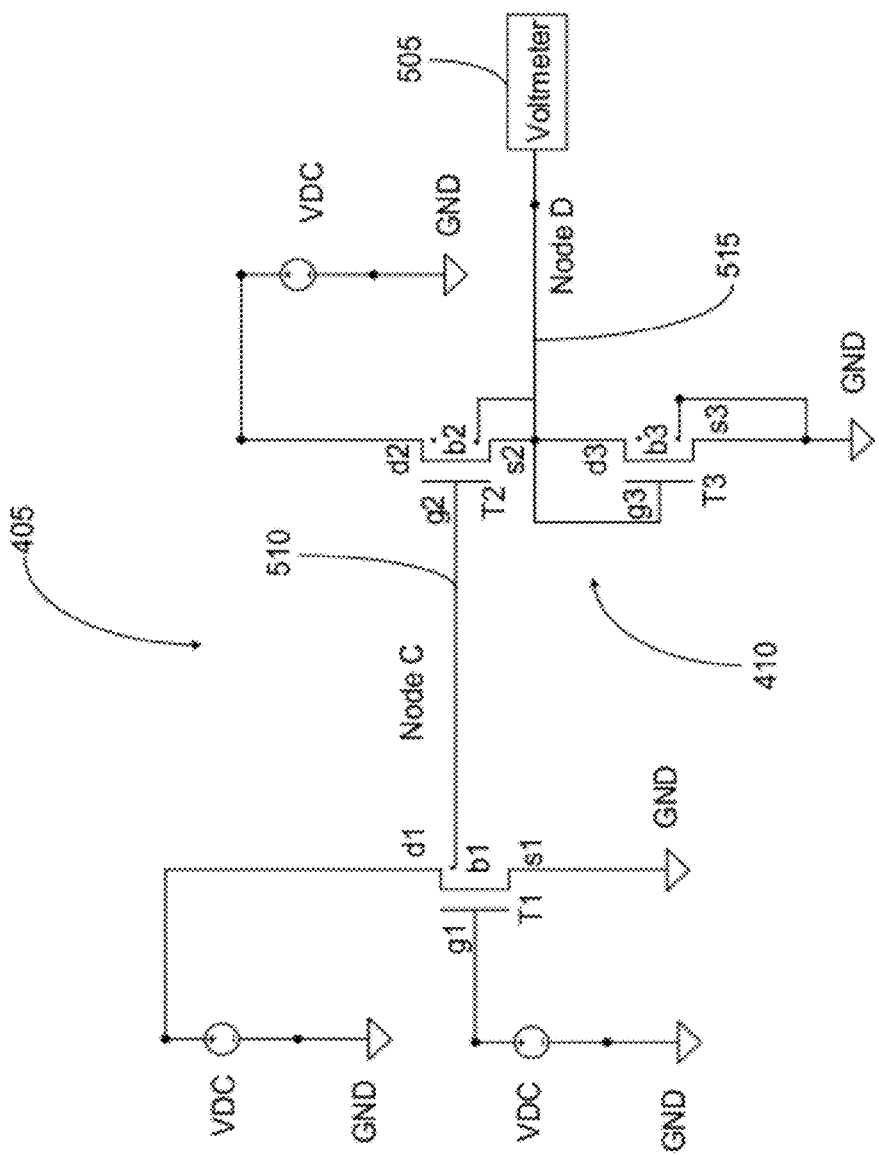
FIG. 5 shows a circuit diagram of the structure depicted in FIG. 4 coupled to a voltmeter to obtain a direct measurement of the floating body voltage according to an embodiment of the present invention.

FIG. 5 shows a circuit diagram of floating body test structure 405 depicted in FIG. 4 coupled to a voltmeter 505 to obtain a direct measurement of the floating body voltage of Node C according to an embodiment of the present invention. With the coupling of voltmeter 505 to floating body test structure 405, an input 510 and an output 515 is formed in sensing circuit 410. In one embodiment, input 510 has a high impedance and output 515 has a low impedance. In the configuration shown in FIG. 5, body region b1 of SOI MOSFET device T1 is coupled to input 510, which is coupled to gate g2 of SOI MOSFET device T2. Coupling body region b1 of SOI MOSFET device T1 to gate g2 of SOI MOSFET device T2 at input 510 forms a floating body node which is shown in FIGS. 4 and 5 as Node C. A voltage measure of Node C is directly obtained at output 515 at Node D.

As shown in FIG. 5, source region s2 of SOI MOSFET FET device T2, and gate g3 and drain region d3 of SOI MOSFET device T3 form output 515 of sensing circuit 410. Source region s2 of SOI MOSFET device T2 is coupled to voltmeter 505 along Node D. Voltmeter 505 is configured to obtain the voltage measure of Node D, which as shown below can be used to quickly and accurately ascertain the floating body voltage of Node C without performance of any complex calculations. Because body region b1 of SOI MOSFET device T1 is coupled to input 510 via gate g2 of SOI MOSFET device T2, voltmeter 505 can be coupled to s2 of SOI MOSFET device T2 to obtain a direct voltage measurement of Node D without loading low flowing current in SOI MOSFET device T1. Since a voltage measurement of Node D can be used to ascertain a voltage measurement for Node C, embodiments of the present invention are able to obtain an accurate measurement of the floating body voltage of a body-contacted SOI MOSFET device T1. As a result, the voltage measurement of the floating body node for SOI MOSFET device T1 provided by voltmeter 505 can be used as an estimate of floating body voltage for other body-contacted SOI MOSFET devices having geometries similar to body-contacted SOI MOSFET device T1.

The following equations describe the relationship between the voltages for Node C and Node D:

$$V(\text{Node } C) - V(\text{Node } D) = V(\text{Node } D), \text{wherein} \quad (1)$$

V(Node C) is the voltage of Node C and V(Node D) is the voltage of Node D. Equation 1 holds as both SOI MOSFET devices T2 and T3 are in saturation and the same drain current flows through them. From equation 1 it follows that:

$$V(\text{Node } C) = 2 * V(\text{Node } D) \quad (2)$$

Therefore, in general terms, using the various embodiments of the present invention, a floating body node having a voltage Vbody can be obtained by measuring the voltage Vout at the output of the sensing circuit 410, and then using the following equation to determine the voltage of the floating body node Vbody:

$$V\text{body} = 2 * V\text{out} \quad (3)$$

Figure 6:
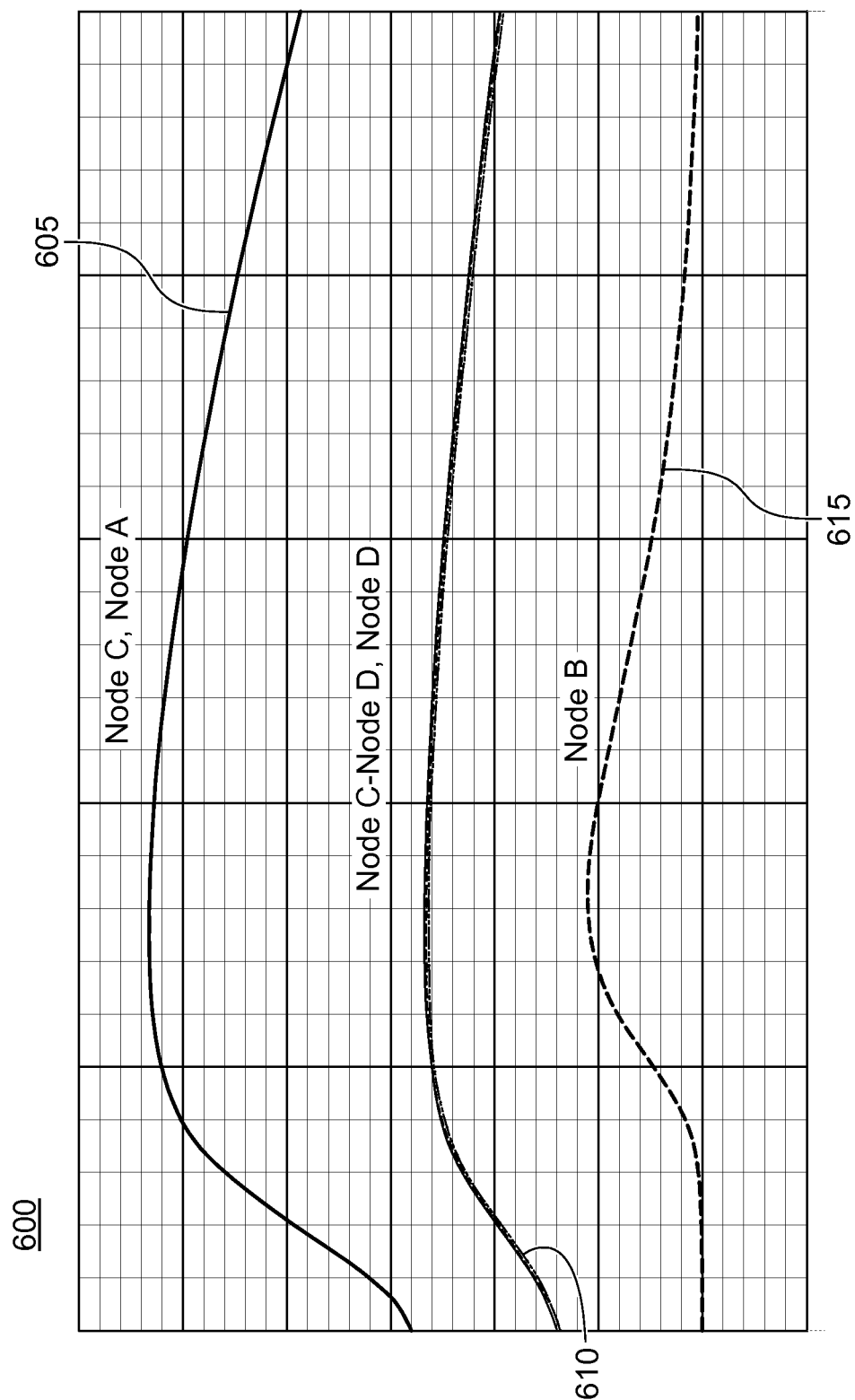
FIG. 6 shows simulation results of the floating body voltage measured in the circuits depicted in FIGS. 3 and 5.

Equations 1 and 2 are verified by simulation results shown in FIG. 6.

FIG. 6 shows simulation results 600 of the floating body voltage measured in the circuits depicted in FIGS. 3 and 5 with simulated values for the circuit components. In addition, FIG. 6 shows how a voltage measurement of Node D can be used to ascertain the floating body voltage of Node C for the circuits depicted in FIGS. 4-5. In FIG. 6, the top simulation result 605 represents the measured voltages at Nodes C and A (floating body nodes) from FIGS. 2 and 4-5 as the gate voltage of the SOI MOSFET device T1 is varied. Simulation result 605 shows that voltage measurements of Nodes C and A are substantially the same. Middle simulation result 610 represents the voltage of Node C minus the voltage of Node D and the voltage of Node D from FIGS. 4-5 as the gate currents of the SOI MOSFET device T1 are varied. Essentially, Nodes C and D are the nodes that are indicative of the floating body node voltage. Simulation result 610 shows that the results for the voltage of Node C minus the voltage of Node D and the voltage of Node D are essentially the same. Because the voltages for Node C and Node A are substantially, the same, one can use a simple algebraic formulation (equation 1) to ascertain from simulation result 610 that Node C is equal to 2*Node D (equation 2). Because Node C is equal to 2*Node D, then if the voltage is known for Node D, it can be used to ascertain the voltage for Node C. As shown herein, various embodiments of the present invention can obtain direct and accurate measurements of the voltage at Node D. As a result, a voltage measurement for Node D can be used to obtain the floating body voltage of Node C because the voltage for Node C is equal to 2*the voltage of Node D. Bottom simulation result 615 shows the voltage measurement of Node B from FIG. 3. As shown in simulation result 615, adding a voltmeter 310 (FIG. 3) to the SOI FET T1 becomes loaded with current, and thus is not able to provide an accurate measurement of the floating body voltage of Node B. In particular, the results of the voltage measurements of Node B are substantially different from the voltage measurements of Nodes C and A as shown in simulation result 605. It is apparent from the simulation results 600 of FIG. 6 that the floating body test structure provided by the various embodiments of the present invention is able to provide an accurate measurement of the floating body node voltage that is not affected by current loading by a voltmeter, and that does not require complex calculations.

In another embodiment of the present invention, the circuit in FIG. 5 can be modified by connecting source region s3 of SOI MOSFET device T3 to a power supply. By applying a negative voltage at this node, SOI FET device T2 and SOI FET device T3 can be kept in saturation for an accurate measurement of Node C for very small voltages on Node C. In this embodiment the equation for the voltage at Node C is:

$$V(\text{Node } C) = 2 * V(\text{Node } D) - V(S3), \text{wherein} \quad (4)$$

V(S3) is the voltage of source region S3 of SOI FET device T3.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A structure, comprising:
a first body-contacted silicon-on-insulator (SOI) metal-oxide-semiconductor-field-effect-transistor (MOSFET) device having a drain region, a source region, a body region separating the drain region from the source region, and a gate disposed above the body region; and
a sensing circuit, coupled to the first body-contacted SOI MOSFET device, having an input and an output, the input of the sensing circuit having a high impedance and the output of the sensing circuit having a low impedance, wherein the body region of the first body-contacted SOI MOSFET device is coupled to the input of the sensing circuit to form a floating body node, wherein a voltage measure of the floating body node is obtained at the output of the sensing circuit.

2. The structure according to claim 1, wherein the voltage measure of the floating body node obtained at the output of the sensing circuit provides an estimate of floating body voltage for other body-contacted SOI MOSFET devices having geometries similar to the first body-contacted SOI MOSFET device.

3. The structure according to claim 1, further comprising a voltmeter configured to be coupled to the output of the sensing circuit to obtain the voltage measure of the floating body node.

4. The structure according to claim 1, wherein the sensing circuit comprises a second body-contacted SOI MOSFET device coupled to a third body-contacted SOI MOSFET device, wherein the second body-contacted SOI MOSFET device and the third body-contacted SOI MOSFET device each has a drain region, a source region, a body region separating the drain region from the source region, and a gate disposed above the body region, and wherein the source region of the second SOI MOSFET and the gate and the drain region of the third body-contacted SOI MOSFET device are connected together to form the output of the sensing circuit, and wherein the gate of the second body-contacted SOI MOSFET device forms the input of the sensing circuit.

5. The structure according to claim 4, wherein the drain region of the second body-contacted SOI MOSFET device is connected to a positive power supply and the source region of the third body-contacted SOI MOSFET device is connected to a negative power supply.

6. The structure of claim 4, wherein the drain region of the second body-contacted SOI MOSFET device is connected to a positive power supply and the source region of the third body-contacted SOI MOSFET device is connected to ground.

7. The structure of claim 4, wherein the input of the sensing circuit has a high impedance and the output of the sensing circuit has a low impedance.

8. A structure, comprising:
an input;
an output;
a power supply port;
a ground port;
a first metal-oxide-semiconductor-field-effect-transistor (MOSFET) device having a drain region, a source region, a body region separating the drain region from the source region, and a gate disposed above the body region, wherein the gate of the first MOSFET device is coupled to the input, the drain region of the first MOSFET device is coupled to the power supply port, the body region of the first MOSFET device is coupled to the source region of the first MOSFET device, the source region of the first MOSFET device is coupled to the output; and
a second metal-oxide-semiconductor-field-effect-transistor (MOSFET) device having a drain region, a source region, a body region separating the drain region from the source region, and a gate disposed above the body region, wherein the drain region of the second MOSFET device is coupled to the source region of the first MOSFET device, the gate of the second MOSFET device is coupled to the drain region of the second MOSFET device, the body region of the second MOSFET device is coupled to the source region of the second MOSFET device, the source region of the second MOSFET device is coupled to the ground port.

9. The structure according to claim 8, wherein the first MOSFET device and the second MOSFET device have identical geometries.

10. The structure according to claim 8, wherein the first MOSFET device and the second MOSFET device have identical doping concentrations.

11. The structure according to claim 8, wherein the first MOSFET device and the second MOSFET device each has a gate input leakage of less than about 1 pico amp (pA).

12. The structure according to claim 8, wherein the first MOSFET device and the second MOSFET device each has a threshold voltage of less than about 100 milli volts (mV).

13. The structure according to claim 8, further comprising a third MOSFET device having a drain region, a source region, a body region separating the drain region from the source region, and a gate disposed above the body region, wherein the gate, source region and drain region of the third MOSFET device are configured to allow for an externally applied voltage, and wherein the body region of the third MOSFET device is coupled to the input that is coupled to the gate of the first MOSFET device.

* * * * *